United States Patent [19]
Chen et al.

[11] Patent Number: 6,100,126
[45] Date of Patent: Aug. 8, 2000

[54] METHOD OF MAKING A RESISTOR UTILIZING A POLYSILICON PLUG FORMED WITH A HIGH ASPECT RATIO

[75] Inventors: Min-Liang Chen; Chih-Hsun Chu, both of Hsinchu, Taiwan

[73] Assignee: Mosel Vitelic Inc., Hsinchu, Taiwan

[21] Appl. No.: 08/861,196

[22] Filed: May 21, 1997

[30]       Foreign Application Priority Data

Nov. 25, 1996 [TW]    Taiwan ................................. 85114541

[51] Int. Cl.$^7$ .............................................. H01L 21/8234
[52] U.S. Cl. .......................... 438/238; 438/234; 438/241; 438/151; 438/152; 438/153; 438/329; 438/330; 438/309; 438/953; 438/668
[58] Field of Search .................................... 438/238, 241, 438/953, 151, 152, 153, 329, 330, 234, 309, 668

[56]              References Cited
U.S. PATENT DOCUMENTS 5,780,326   7/1998   Dennison et al. ....................... 438/152
5,821,160  10/1998   Rodriguez et al. ..................... 438/601

*Primary Examiner*—John F. Niebling
*Assistant Examiner*—Lynn A. Gurley
*Attorney, Agent, or Firm*—Bacon & Thomas

[57]                ABSTRACT

A method of making a resistor begins with forming a field effect transistor on a silicon semiconductor substrate. Then a first insulating layer is deposited on the field effect transistor. The first insulating layer is etched by the photolithography and etching techniques to form a bit line contact, and a bit line is subsequently formed. Next, upon the entire structure, a second insulating layer is formed and etched by the photolithography and ion etching techniques to form a contact hole with high aspect ratio. A polysilicon layer is deposited across the contact hole and the polysilicon outside the contact hole is removed, forming a polysilicon plug in the contact hole. Then, a third insulating layer is formed and etched to form a contact hole for metallurgy. After a first metal interconnection is formed, a third insulating layer is formed upon the entire structure and then etched to form a via hole by the photolithography and plasma etching techniques. A second metal interconnection is then formed and completes the static random access memory (SRAM) cell.

9 Claims, 10 Drawing Sheets

6,100,126

1

METHOD OF MAKING A RESISTOR UTILIZING A POLYSILICON PLUG FORMED WITH A HIGH ASPECT RATIO

BACKGROUND OF THE INVENTION (1) Field of the Invention

The present invention relates to a method of making a resistor in an integrated circuit with a limited layout area, and more particularly to a method of making a highly packed static random access memory (SRAM) cell with a resistor.

(2) Description of the Prior Art

Referring first to FIG. 1, which illustrates a method of making the conventional resistor in a SRAM cell. First, in an N-type semiconductor substrate 50 is formed a P-tub 52, on which is overlaid a field oxide layer 54. Then, field effect transistors (FETs) are formed, which comprise gate oxide layers 56, gate electrodes 58, capped nitride 59, silicon nitride or silicon oxide spacers 62, N⁻ lightly doped areas 60 and N⁺ heavily doped source/drain regions 64.

After a first insulating layer 66 is deposited and etched by the photolithography and etching techniques to form a bit line contact hole, a bit line 67A/67B is subsequently formed. The bit line 67A/67B is usually made of polycide, which is comprised of polysilicon 67A and tungsten suicide 67B. Then, a second insulating layer 70 is formed upon the entire structure. After the second insulating layer 70 is planarized, the second insulating layer 70 and the first insulating layer 66 are etched by the photolithography and plasma etching techniques to form a contact hole. Then, a polysilicon layer 72 is deposited across the contact hole and etched by the photolithography and etching techniques to form a polysilicon load resistor 72.

A third insulating layer 74 and a fourth insulating layer 76 are subsequently formed and etched by the photolithography and etching techniques to form a metallurgy contact hole. Then a first metal interconnection 78/80/82 is formed, which comprises titanium nitride 78, tungsten plug 80, and aluminum alloy 82. This structure is well-known.

A fifth insulating layer 84 is then deposited and etched by the photolithography and plasma etching techniques to form a via hole (not shown). Next, a second metal interconnection 86 is formed across the via hole and electrically connects with the first metal interconnection 78/80/82, which also comprises the well-known structure of titanium nitride, tungsten plug, and aluminum alloy. Then, a sixth insulating layer 88 and a seventh insulating layer 90 are deposited as passivation layers. The sixth insulating layer 88 is made of silicon dioxide formed by plasma enhanced chemical vapor deposition (PECVD) at the temperature of between 300 to 400° C. with tetraethylorthosilicate (TEOS) reactant gas. The seventh insulating layer 90 is made of silicon nitride formed by PECVD at the temperature of between 300 to 400° C.

However, as depicted in FIG. 1, the second insulating layer 70 and the first insulating layer 66 are very thin. When making resistor 72, it is necessary to extend the length of the resistor 72 in the horizontal direction to acquire higher resistance values, that wastes a lot of layout areas. In this way, the packing density of the SRAM cell is limited.

The present invention provides a method of making a resistor utilizing a polysilicon plug with a high aspect ratio, which extends in the vertical direction. Therefore, the layout area can be saved to accomplish higher packing density of a SRAM cell.

Within the prior art, there are some references addressing different resistor structures and methods of making the same,

2 however, none appear to be directed to the specific application of the present invention, namely the use of the polysilicon plug formed with a high aspect ratio to make the resistor with a small layout area. For example, U.S. Pat. No. 4,835,588 to Nawata et al. provides a transistor with a plurality of resistors regions commonly connected through an emitter wiring electrodes. The resistor regions are formed in an elongated shape. U.S. Pat. No. 5,400,277 to Nowak discloses a method of making the resistor by first forming a trench extending from top of the wafer through an isolation region of the wafer to a silicon base of the wafer. A resistive layer is then formed in the trench to form the resistor.

SUMMARY OF THE INVENTION

An object of the present invention is to provide a method of making a resistor in an integrated circuit with a limited layout area.

Another object of the present invention is to provide a method of achieving high packing density of an integrated circuit chip.

According to the present invention, a method of making a resistor begins with forming a field effect transistor on a silicon semiconductor substrate. Then a first insulating layer is deposited on the field effect transistor. The first insulating layer is etched by the photolithography and etching techniques to form a bit line contact, and a bit line is subsequently formed. Next, upon the entire structure, a second insulating layer is formed and etched by the photolithography and plasma etching techniques to form a contact hole with high aspect ratio. A polysilicon layer is deposited across the contact hole and overlaying the second insulating layer. Then the polysilicon layer outside the contact hole is removed to form a polysilicon plug in the contact hole. Then, a third insulating layer is formed and etched to form a contact hole for metallurgy. After a first metal interconnection is formed, a third insulating layer is formed upon the entire structure and then etched to form a via hole by the photolithography and ion etching techniques. A second metal interconnection is then formed. The static random access memory (SRAM) cell is completed.

BRIEF DESCRIPTION OF THE DRAWINGS

Other objects and advantages of the present invention will be understood by reading the detailed explanation of embodiments with reference to the accompanying drawings in which

FIG. 1 shows the schematic cross sectional view of a conventional method of forming a resistor in accordance with the prior art.

FIG. 2 shows the schematic cross sectional views of the SRAM cell structure after the field effect transistor is formed.

FIG. 3 shows the schematic cross sectional views of the SRAM cell structure after the first dielectric layer is formed and etched to form the bit line contact hole and the bit line is subsequently formed.

FIG. 4 shows the schematic cross sectional views of the SRAM cell structure after the second insulating layer is formed and planarized.

FIG. 5 shows the schematic cross sectional views of the SRAM cell structure after the second insulating layer is etched by the photolithography and ion etching techniques to form the contact hole.

FIG. 6 shows the schematic cross sectional views of the SRAM cell structure after the polysilicon layer is formed to fill the contact hole.

FIG. 7 shows the schematic cross sectional views of the SRAM cell structure after the polysilicon outside the contact hole is removed to form a polysilicon plug in the contact hole.

FIG. 8 shows the schematic cross sectional views of the SRAM cell structure after the third insulating layer is formed and the third insulating layer, the second insulating layer, and the first insulating layer are etched to form a metallurgy contact hole.

FIG. 9 shows the schematic cross sectional views of the SRAM cell structure after the first metal interconnection is formed.

FIG. 10 shows the schematic cross sectional views of the SRAM cell structure after the fourth insulating layer, the second metal interconnection, the fifth insulating layer, and the sixth insulating layer are formed.

DETAILED DESCRIPTION OF THE INVENTION

The present invention will be described in detail below with the preferred embodiment of double layer metallurgy technology.

Figure 1:
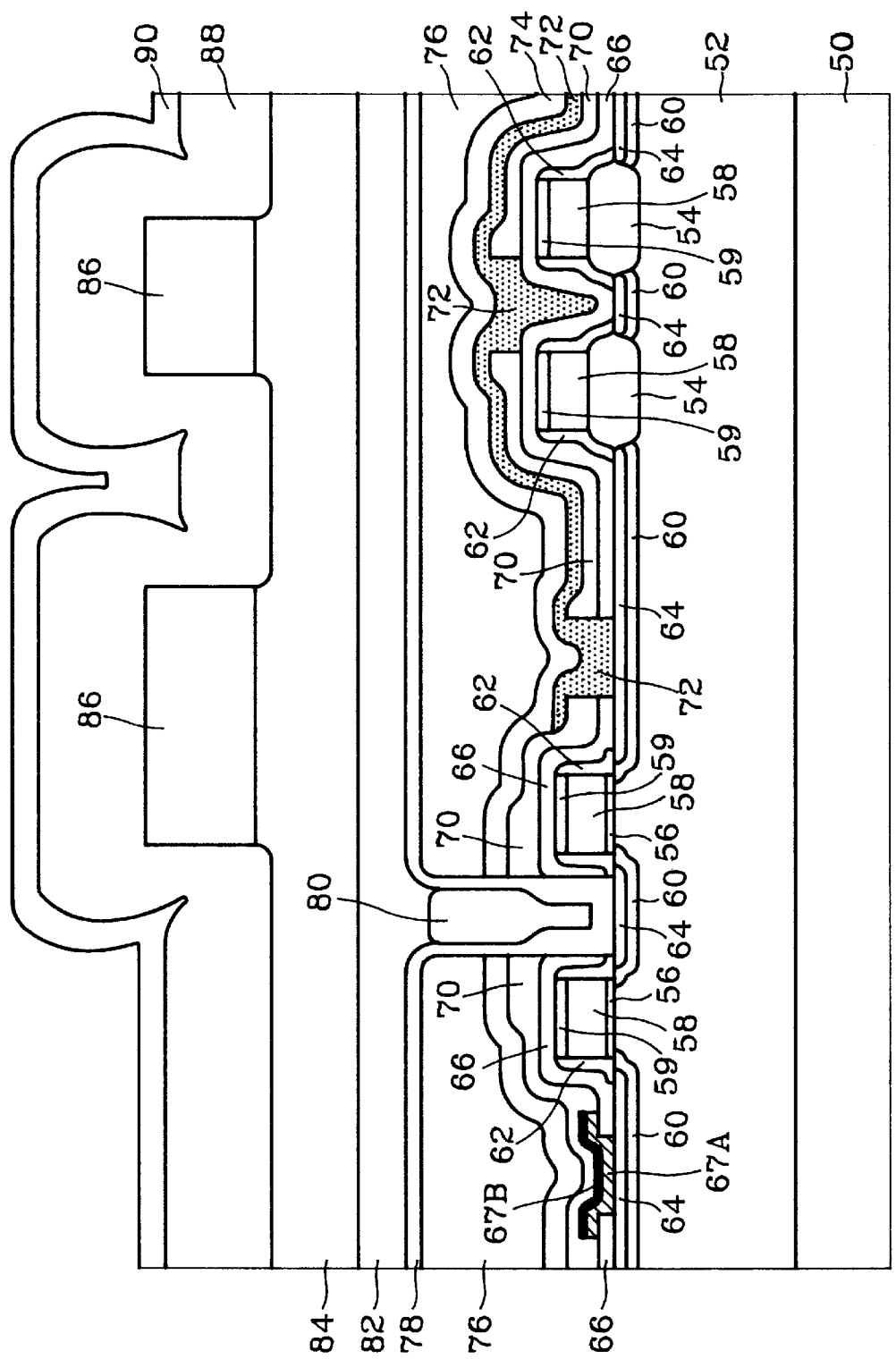
FIG. 1 shows the schematic cross sectional view of a substrate according to the prior art process.
Figure 2:
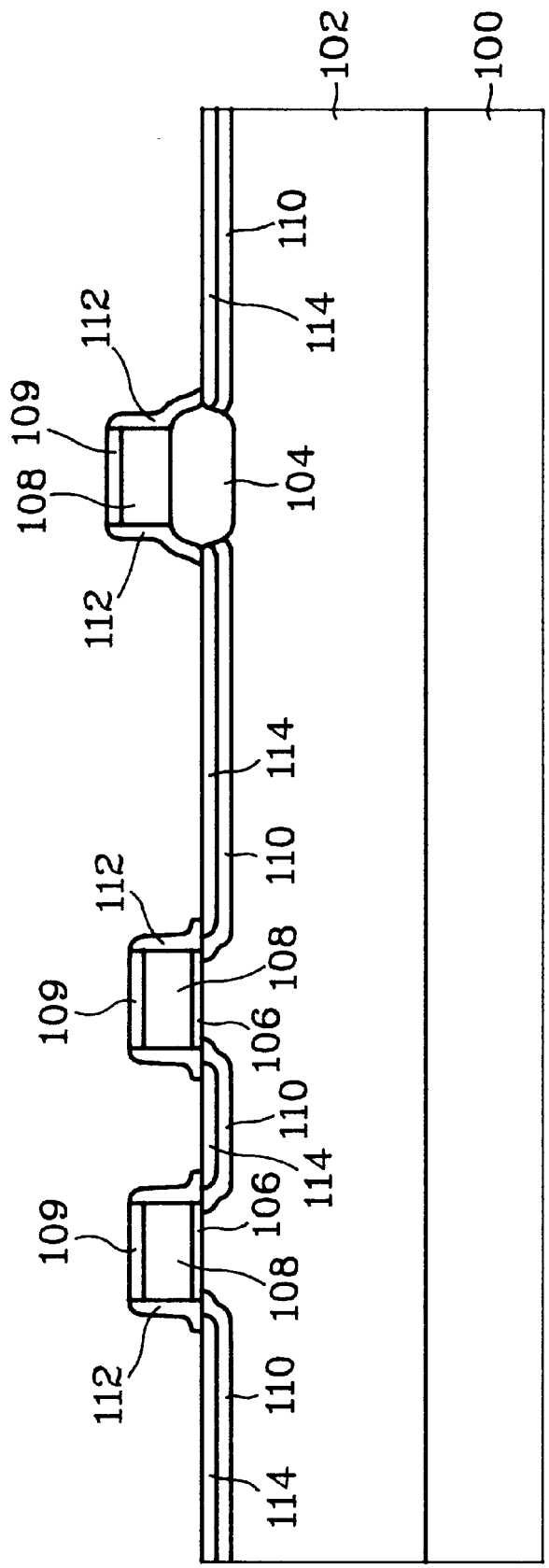
FIGS. 2 to 10 show schematic cross sectional views of a SRAM cell in accordance with the embodiment of the present invention.

An N-type, silicon semiconductor substrate 100, having a <100>crystallographic orientation, is used, and schematically shown in FIG. 2. First, a P-tub 102 is formed in the substrate 100, followed by the deposition of a field oxide layer 104 to a thickness of 3000 to 6500 Angstroms to isolate the electrical elements. Then, a field effect transistor is formed, which comprises the gate oxide layer 106, gate electrodes 108, the capped nitride layer 109, spacers 112, the N⁻ lightly doped regions 110, and the N⁺ heavily doped source/drain regions 114, as depicted in FIG. 2. The gate oxide layer 104 is grown to a thickness of 50 to 200 Angstroms. The gate electrode 108 is formed of polysilicon or polycide by low pressure chemical vapor deposition (LPCVD) to a thickness of 2000 to 4000 Angstroms. The capped nitride layer 109 is formed by LPCVD to a thickness of 800 to 1600 Angstroms. Before the spacers 112 are formed, the N⁻ lightly doped region 110 is formed by an implant of phosphorus ($P^{31}$) ions with a dosage of $1\times10^{13}$ to $1\times10^{14}$ ions/cm² at an energy of 20 to 50 keV. After the spacers 112 are formed, an implant of Arsenic ($As^{75}$) ions is performed with a dosage of $1\times10^{15}$ to $1\times10^{16}$ ions/cm² at an energy of 40 to 80 keV, forming the N⁺ heavily doped source/drain regions 114. In this way, the field effect transistor is completed, as shown in FIG. 2.

Figure 3:
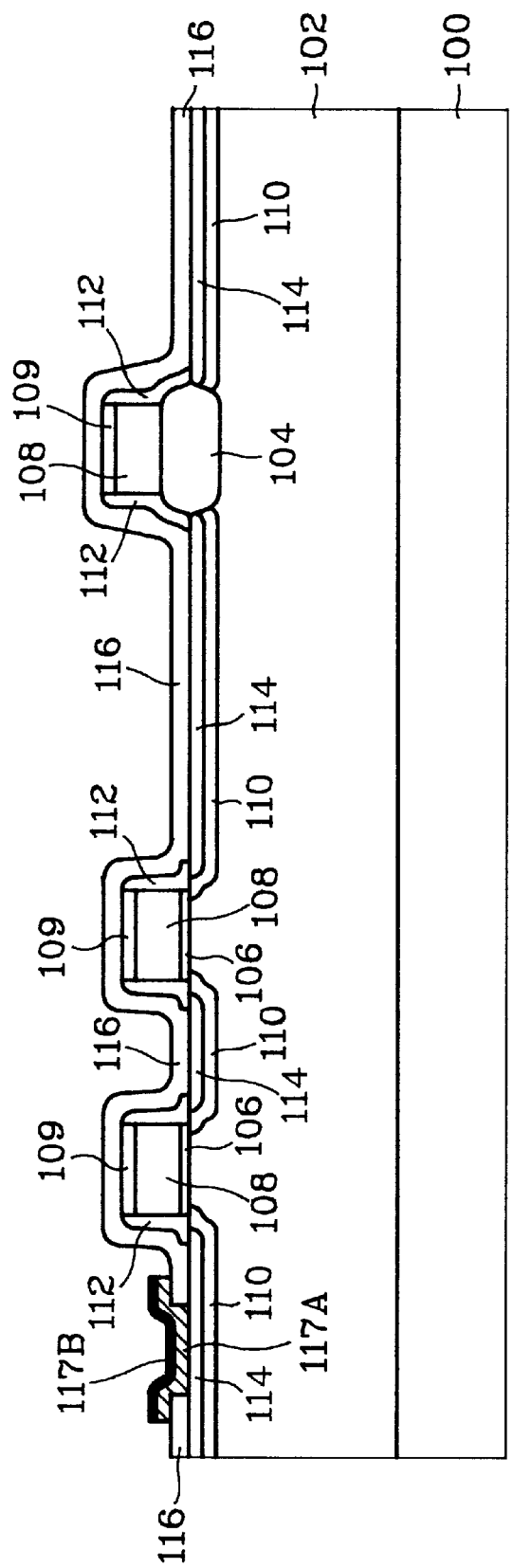
Figure 4:
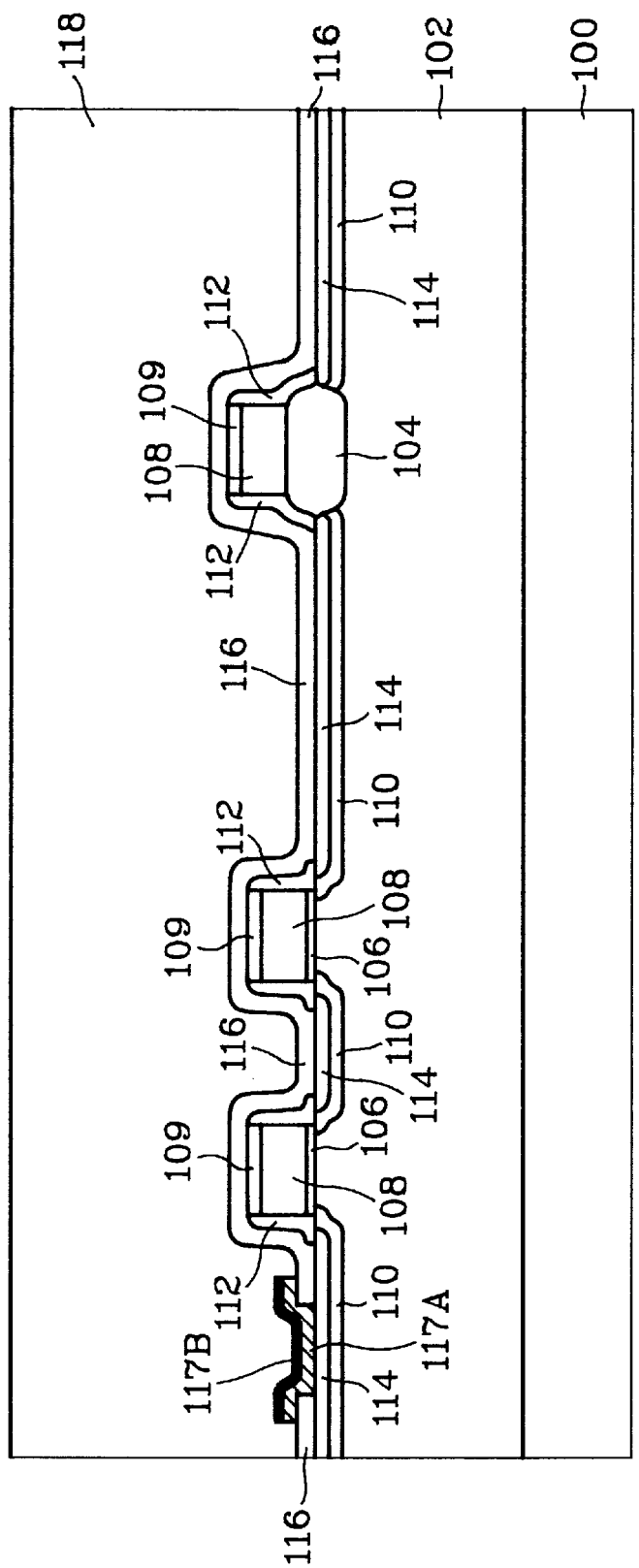

Refer now to FIG. 3 and FIG. 4. A first insulating layer 116 is deposited and etched by the photolithography and etching techniques to form a bit line contact hole, followed by the formation of a bit line 117A/117B. The bit line 117A/117B is usually made of polycide, which is consist of polysilicon 117A and tungsten silicide 117B double layers. Then a second insulating layer 118 is formed and planarized, as depicted in FIG. 4. The thick second insulating layer 118 is formed of borophospho-silicate glass (BPSG) by CVD to a thickness of 4000 to 10000 Angstroms in order to form the contact hole with high aspect ratio. The second insulating layer 118 is planarized by the conventional chemical mechanical polishing (CMP) technique.

Figure 5:
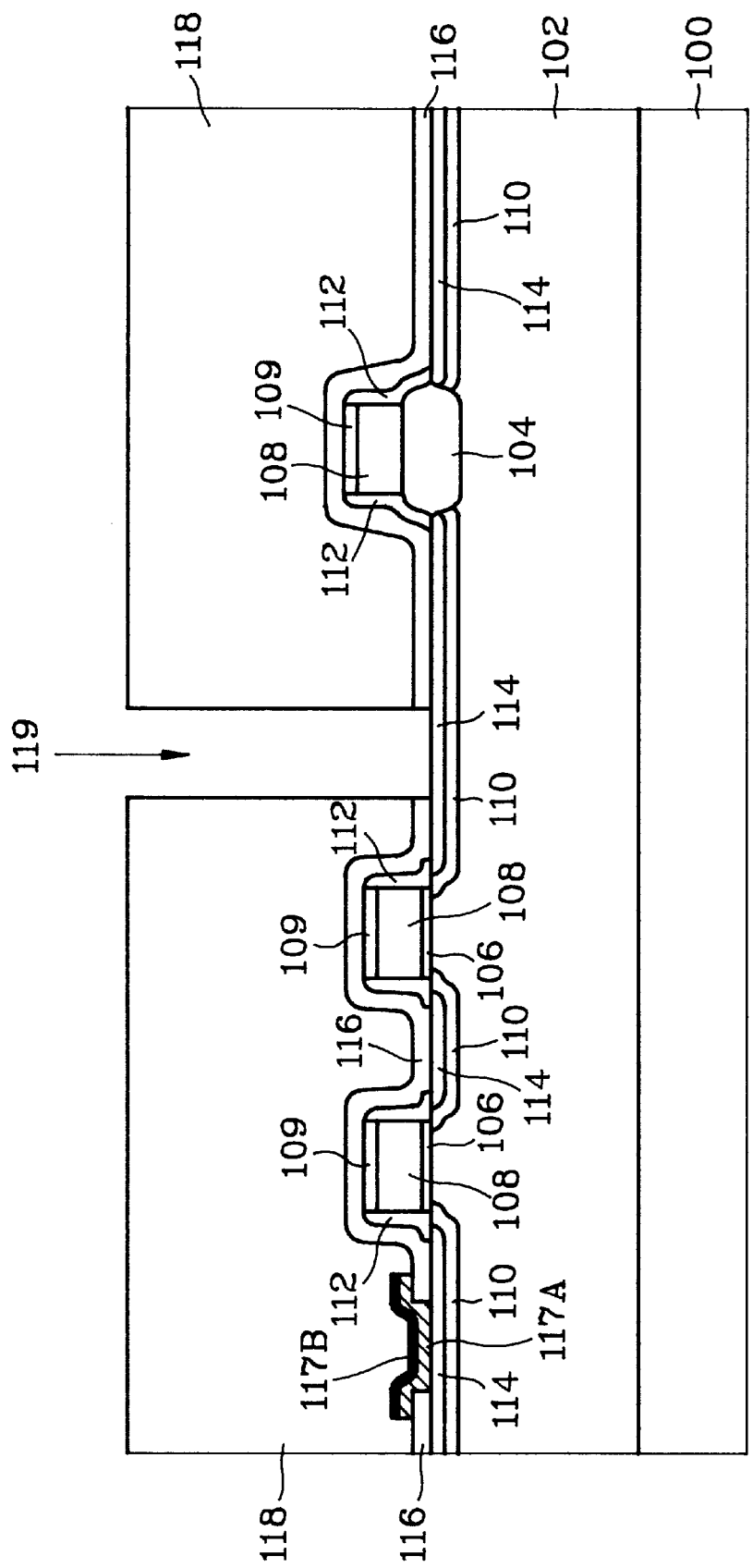
Figure 6:
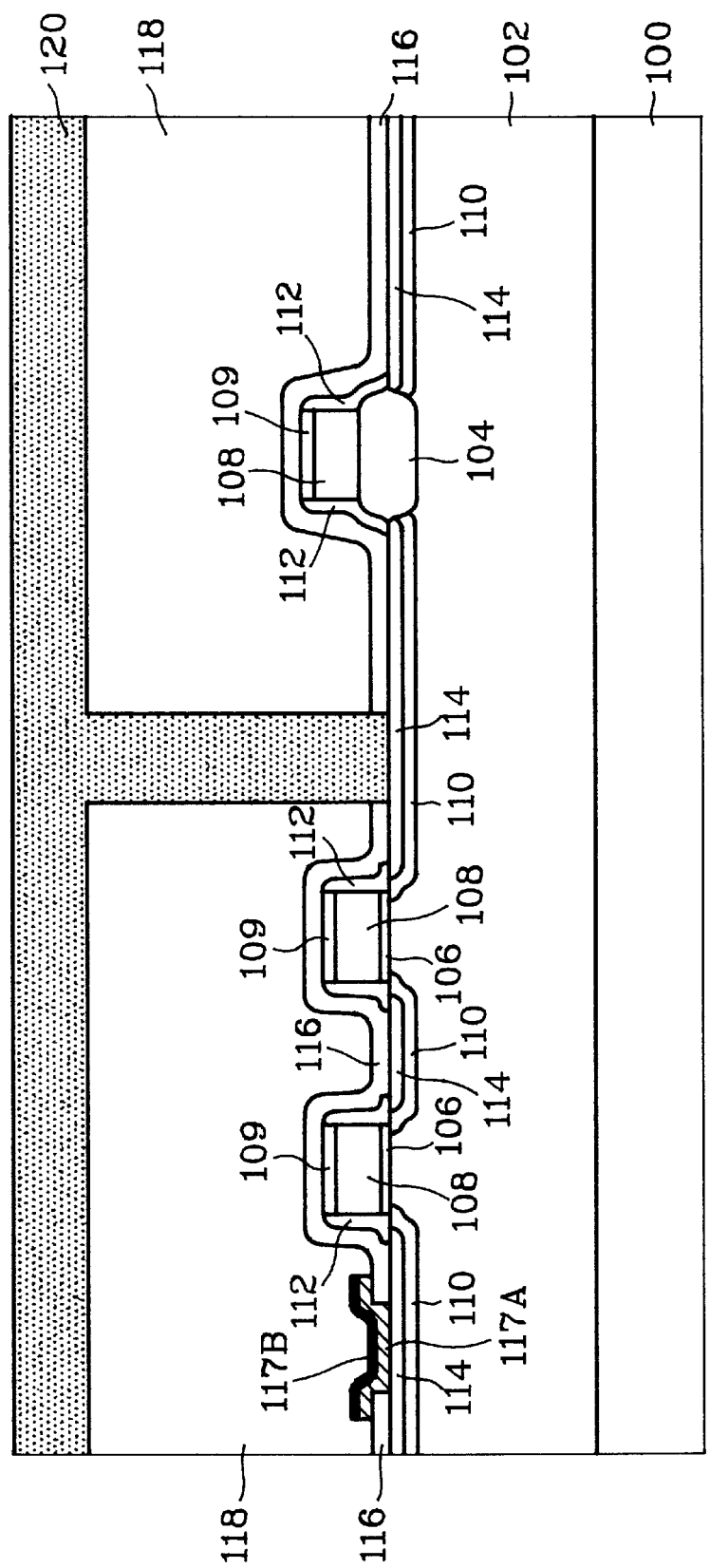
Figure 7:
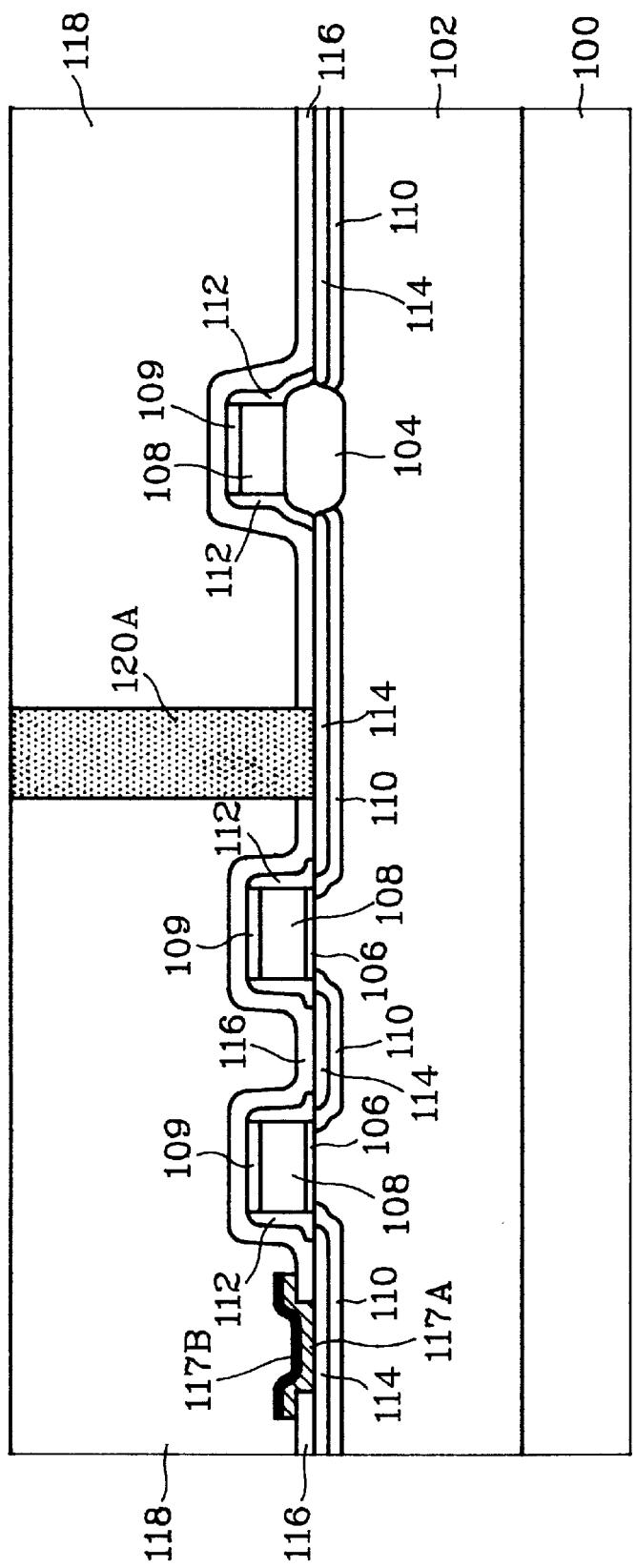

Next, referring to FIG. 5, FIG. 6, and FIG. 7, the featuring step of the present invention is explained. The second insulating layer 118 is etched by the photolithography and plasma etching techniques to form a contact hole 119, as shown in FIG. 5. Then, as depicted in FIG. 6, a polysilicon layer 120 is deposited overlaying the second insulating layer 118 and filling into the contact hole 119. The polysilicon layer 120 outside the contact hole 119 is then removed to form a polysilicon plug 120A in the contact hole 119, as shown in FIG. 7. The polysilicon plug 120A is appropriately doped to form the passive elements such as resistors. Since the polysilicon plug 120A is formed in the contact hole 119 with high aspect ratio and extending vertically, the passive elements such as resistors formed therein take little layout areas. Therefore, the high packing density of a static random access memory (SRAM) cell can be achieved by the present invention.

When forming the contact hole 119, the second insulating layer 118 is usually etched by magnetic enhanced reactive ion etching (MERIE) with fluorine-containing gases such as carbon tetrafluoride ($CF_4$) and fluoroform ($CHF_3$) as reactant gases. The resistance of the resistor is determined by the doping concentration of the polysilicon 120. The polysilicon layer 120 can be doped with phosphorus by an in-situ doping process when deposited by LPCVD with the combined gas sources of phosphine ($PH_3$), silane and nitrogen as reactive gases at a reaction temperature of about 570° C. The doping concentration is determined by the flux of phosphine ($PH_3$) gas. After the polysilicon layer 120 is doped, a portion of the polysilicon 120 outside the contact hole 119 is removed by an plasma etching back or chemical mechanical polishing (CMP) techniques, resulting in the polysilicon plug 120A.

Figure 8:
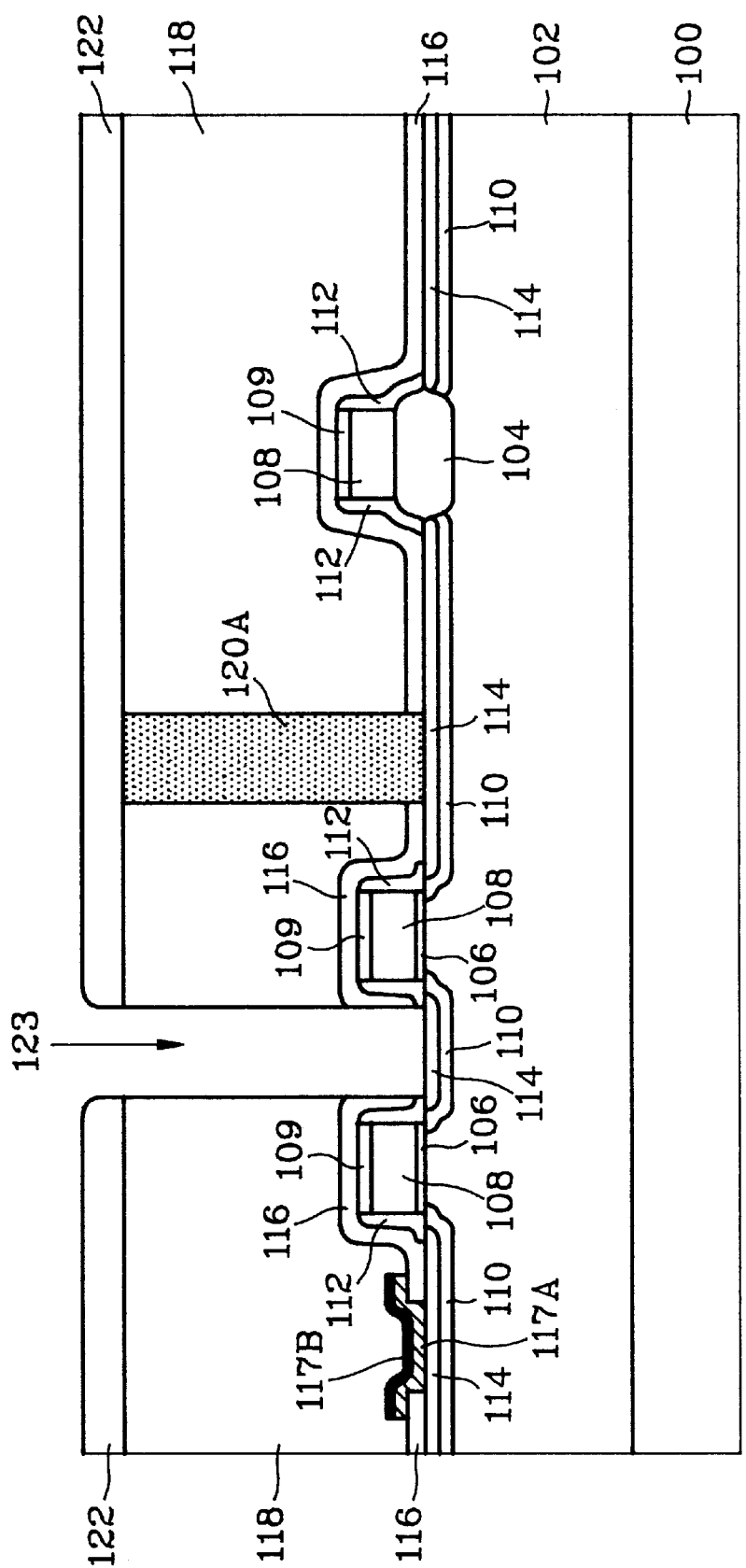
Figure 9:
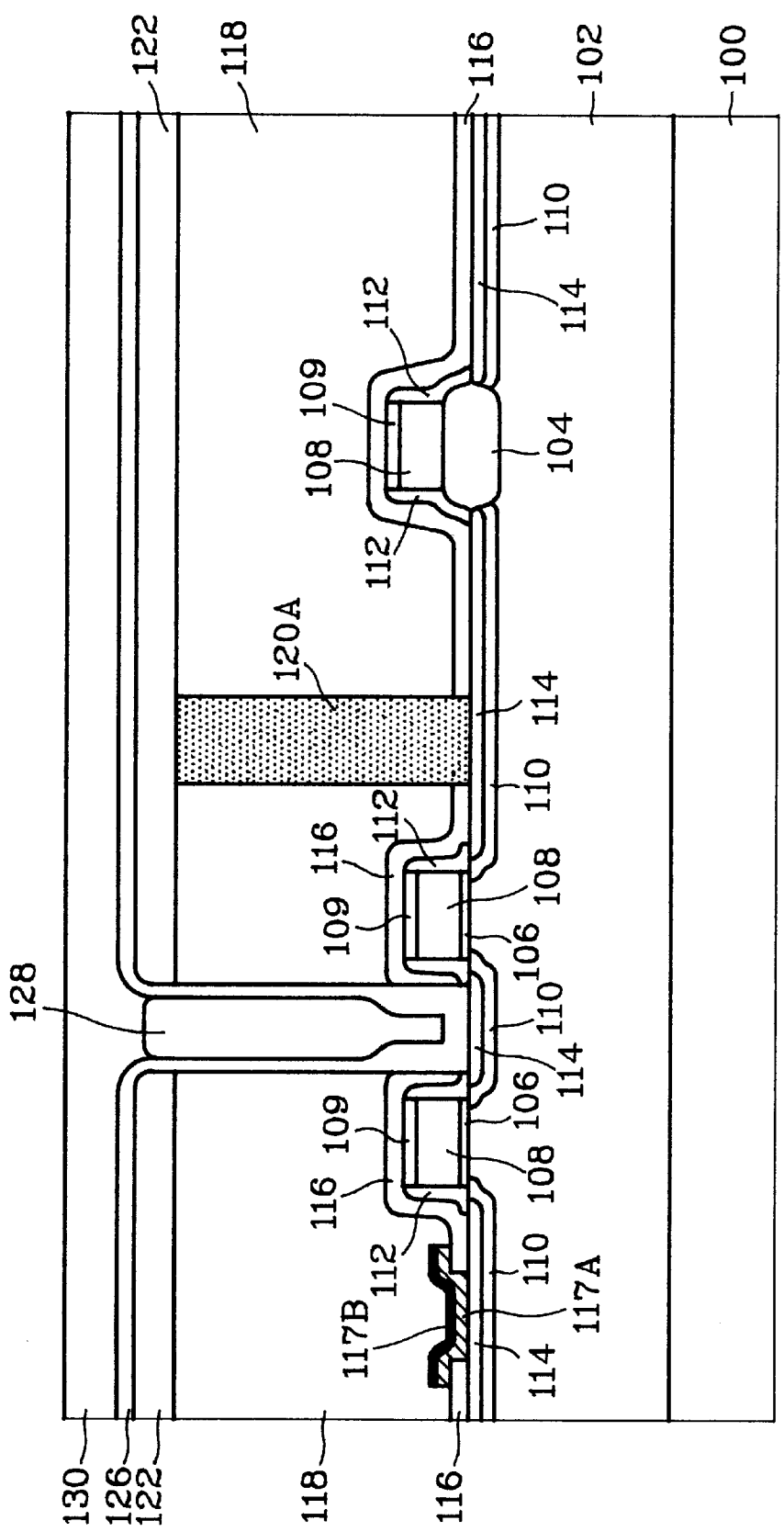

Then, as depicted in FIG. 8 and FIG. 9, a third insulating layer 122 is deposited. The third insulating layer 122, the second insulating layer 118, and the first insulating layer 116 are etched to form a metallurgy contact hole 123, as shown in FIG. 8. Then a first metal interconnection 126/128/130 is formed, which comprises the well-known structure of nitride titanium 126, tungsten plug 128, and aluminum alloy 130, as shown in FIG. 9.

Figure 10:
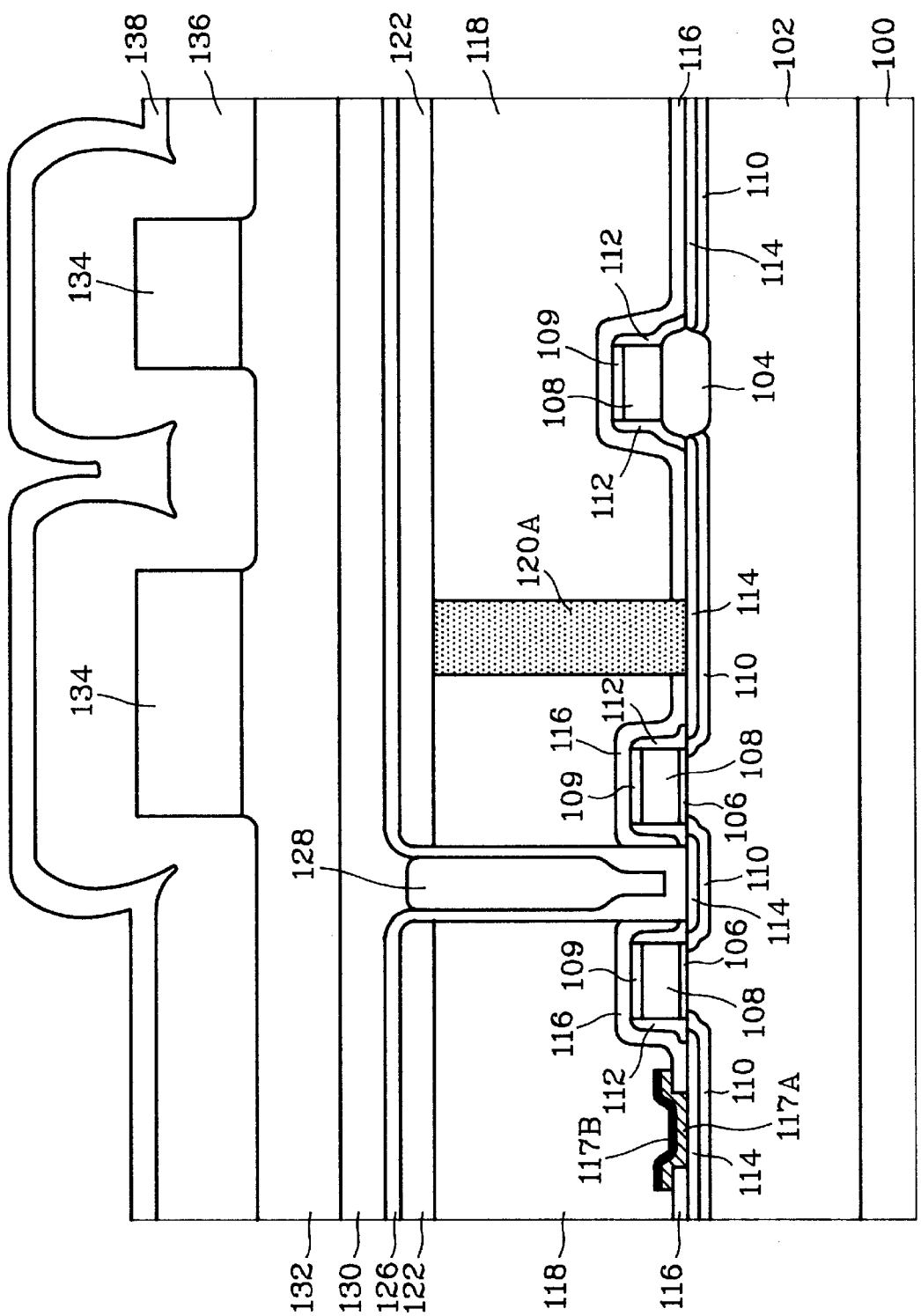

Referring now to FIG. 10, a fourth insulating layer 132 is deposited and etched by the photolithography and plasma etching techniques to form a via hole (not shown). Next, a second metal interconnection 134 is formed across the via hole and electrically connects with the first metal interconnection 126/128/130, which also comprises the well-known structure of nitride titanium, tungsten plug, and aluminum alloy. At this time, a fifth insulating layer 136 and a sixth insulating layer 138 are deposited as passivation layers. The fifth insulating layer 136 is made of silicon dioxide formed by PECVD technique at the temperature of between 300 to 400° C. using tetraethylorthosilicate (TEOS) as reactant gas. The sixth insulating layer 138 is made of silicon nitride formed by PECVD at the temperature of between 300 to 400° C. Finally, The static random access memory (SRAM) cell with high packing density according to the present invention is accomplished.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of making a resistor in an integrated circuit, which comprises the steps of:
   (a) forming an electrical element on a silicon semiconductor substrate;
   (b) depositing a first insulating layer and etching said first insulating layer to form a bit line contact hole;
   (c) forming a bit line;
   (d) forming a second insulating layer and etching said second insulating layer to form a contact hole;
   (e) depositing a polysilicon layer across said contact hole and overlaying said second insulating layer;
   (f) removing said polysilicon outside said contact hole to form a polysilicon plug having a high aspect ratio in said contact hole;
   (g) doping said polysilicon plug to form the resistor;
   (h) depositing a third insulating layer and etching said third insulating layer to form a metallurgy contact hole; and
   (i) forming a metal interconnection.

2. The method as in claim 1, wherein said electrical element is a field effect transistor.

3. The method as in claim 1, wherein said electrical element is a bipolar transistor.

4. The method as in claim 1, wherein said second insulating layer is formed of borophospho-silicate glass (BPSG) with a thickness of 4000 to 10000 Angstroms.

5. The method as in claim 1, wherein said second insulating layer is etched by magnetic enhanced reactive ion etching with carbon tetrafluoride ($CF_4$) and fluoroform ($CHF_3$) as reactant gases to form said contact hole.

6. The method as in claim 1, wherein said polysilicon layer is deposited by low pressure chemical vapor deposition with the combined gas sources of phosphine ($PH_3$), silane and nitrogen as reactive gases.

7. The method as in claim 6, wherein said polysilicon plug is doped with phosphorus by an in-situ doping process when said polysilicon layer is deposited.

8. The method as in claim 1, wherein said polysilicon layer outside the contact hole is removed by chemical mechanical polishing (CMP).

9. The method as in claim 1, wherein said polysilicon layer outside the contact hole is removed by plasma etching back.

* * * * *